US009893236B2

(12) United States Patent
Craven et al.

(10) Patent No.: US 9,893,236 B2
(45) Date of Patent: Feb. 13, 2018

(54) NON-POLAR (AL,B,IN,GA)N QUANTUM WELLS

(71) Applicant: THE REGENTS OF THE UNIVERSITY OF CALIFORNIA, Oakland, CA (US)

(72) Inventors: Michael D. Craven, Goleta, CA (US); Steven P. DenBaars, Goleta, CA (US)

(73) Assignees: THE REGENTS OF THE UNIVERSITY OF CALIFORNIA, Oakland, CA (US); JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 14/921,734

(22) Filed: Oct. 23, 2015

(65) Prior Publication Data
US 2016/0043278 A1 Feb. 11, 2016

Related U.S. Application Data

(63) Continuation of application No. 10/582,390, filed as application No. PCT/US03/39355 on Dec. 11, 2003, (Continued)

(51) Int. Cl.
H01L 33/00 (2010.01)
H01L 33/24 (2010.01)
(Continued)

(52) U.S. Cl.
CPC ............. H01L 33/24 (2013.01); C30B 25/02 (2013.01); C30B 25/04 (2013.01); C30B 25/105 (2013.01);
(Continued)

(58) Field of Classification Search
CPC .............................. H01L 33/005; H01L 33/26
(Continued)

(56) References Cited

U.S. PATENT DOCUMENTS 5,926,726 A 7/1999 Bour et al.
6,072,197 A 6/2000 Horino et al.
(Continued)

FOREIGN PATENT DOCUMENTS

EP 1385196 1/2004
WO 03/089694 10/2003
(Continued)

OTHER PUBLICATIONS

JP Office Action dated Dec. 7, 2010 (Application No. 2005-512863) with translation.
(Continued)

Primary Examiner — David Vu
Assistant Examiner — Brandon Fox
(74) Attorney, Agent, or Firm — Gates & Cooper LLP

(57) ABSTRACT

A method of fabricating non-polar a-plane GaN/(Al,B,In,Ga)N multiple quantum wells (MQWs). The a-plane MQWs are grown on the appropriate GaN/sapphire template layers via metalorganic chemical vapor deposition (MOCVD) with well widths ranging from 20 Å to 70 Å. The room temperature photoluminescence (PL) emission energy from the a-plane MQWs followed a square well trend modeled using self-consistent Poisson-Schrodinger (SCPS) calculations. Optimal PL emission intensity is obtained at a quantum well width of 52 Å for the a-plane MQWs.

18 Claims, 6 Drawing Sheets

Related U.S. Application Data now abandoned, which is a continuation-in-part of application No. PCT/US03/21918, filed on Jul. 15, 2003, and a continuation-in-part of application No. PCT/US03/21916, filed on Jul. 15, 2003, and a continuation-in-part of application No. 10/413,691, filed on Apr. 15, 2003, now abandoned, and a continuation-in-part of application No. 10/413,690, filed on Apr. 15, 2003, now Pat. No. 7,091,514, and a continuation-in-part of application No. 10/413,913, filed on Apr. 15, 2003, now Pat. No. 6,900,070.

(60) Provisional application No. 60/433,843, filed on Dec. 16, 2002, provisional application No. 60/433,844, filed on Dec. 16, 2002, provisional application No. 60/372,909, filed on Apr. 15, 2002.

(51) Int. Cl.

| | |
|---|---|
| C30B 25/02 | (2006.01) |
| C30B 25/04 | (2006.01) |
| C30B 25/10 | (2006.01) |
| C30B 25/18 | (2006.01) |
| C30B 29/40 | (2006.01) |
| C30B 29/60 | (2006.01) |
| H01L 21/02 | (2006.01) |
| H01L 29/15 | (2006.01) |
| H01L 33/06 | (2010.01) |
| H01L 33/32 | (2010.01) |
| H01L 29/20 | (2006.01) |

(52) U.S. Cl.
CPC ............ *C30B 25/18* (2013.01); *C30B 29/403* (2013.01); *C30B 29/406* (2013.01); *C30B 29/605* (2013.01); *H01L 21/0237* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/02516* (2013.01); *H01L 29/155* (2013.01); *H01L 33/007* (2013.01); *H01L 33/0025* (2013.01); *H01L 33/06* (2013.01); *H01L 33/32* (2013.01); *H01L 33/325* (2013.01); *H01L 29/2003* (2013.01)

(58) Field of Classification Search
USPC .......................................................... 257/79
See application file for complete search history.

(56) References Cited

U.S. PATENT DOCUMENTS

| | | | |
|---|---|---|---|
| 6,156,581 A | 12/2000 | Vaudo et al. | |
| 6,177,057 B1 | 1/2001 | Purdy | |
| 6,229,151 B1* | 5/2001 | Takeuchi | B82Y 20/00 257/103 |
| 6,298,079 B1 | 10/2001 | Tanaka et al. | |
| 6,440,823 B1 | 8/2002 | Vaudo et al. | |
| 6,468,882 B2 | 10/2002 | Motoki et al. | |
| 6,569,704 B1 | 5/2003 | Takeuchi et al. | |
| 6,576,932 B2* | 6/2003 | Khare | H01L 33/007 257/103 |
| 6,590,336 B1 | 7/2003 | Kadota | |
| 6,677,619 B1* | 1/2004 | Nagahama | B82Y 20/00 251/200 |
| 6,849,472 B2 | 2/2005 | Krames et al. | |
| 6,882,051 B2 | 4/2005 | Majumdar et al. | |
| 6,951,695 B2 | 10/2005 | Xu et al. | |
| 6,977,953 B2* | 12/2005 | Hata | B82Y 20/00 372/43.01 |
| 6,996,147 B2 | 2/2006 | Majumdar et al. | |
| 7,057,211 B2 | 6/2006 | Dwilinski et al. | |
| 7,132,730 B2 | 11/2006 | Dwilinski et al. | |
| 7,208,096 B2 | 4/2007 | Akkipeddi et al. | |
| 2001/0024312 A1 | 9/2001 | Lee | |
| 2001/0029086 A1 | 10/2001 | Ogawa et al. | |
| 2002/0084467 A1* | 7/2002 | Krames | B82Y 20/00 257/103 |
| 2002/0098641 A1 | 7/2002 | Tsuda et al. | |
| 2003/0198837 A1 | 10/2003 | Craven et al. | |
| 2004/0108513 A1 | 6/2004 | Narukawa et al. | |
| 2004/0135222 A1 | 7/2004 | Alfano et al. | |
| 2004/0251471 A1 | 12/2004 | Dwilinski et al. | |
| 2004/0261692 A1 | 12/2004 | Dwilinski et al. | |
| 2005/0205884 A1 | 9/2005 | Kim et al. | |
| 2006/0138431 A1* | 6/2006 | Dwilinski | B82Y 20/00 257/79 |

FOREIGN PATENT DOCUMENTS

| | | | |
|---|---|---|---|
| WO | 03098757 | 11/2003 | |
| WO | WO 03098757 A1 * | 11/2003 | ............... C30B 7/00 |

OTHER PUBLICATIONS

EP Search Report dated Jan. 12, 2011 (Application No. 03790447).

Craven, Michael D., et. al., "Characterization of a-plane GaN/(Al,Ga)N multiple quantum wells grown via metalorganic chemical vapor deposition", Japanese Journal of Applied Physics, Part 2 (Letters) Japan Soc. Appl. Phys. Japan, vol. 42, No. 3A, Mar. 1, 2003, pp. L235-L238, XP002614887.

Chen, Changqing et. al., "Ultraviolet light emitting diodes using non-polar a-plane GaN—AlGaN multiple quantum wells", Japanese Journal of Applied Physics, Part 2 (Letters) Japan Soc. Appl. Phys. Japan, vol. 42, No. 9AB, Sep. 15, 2003, pp. L1039-L1040, XP002614886.

Kuokstis, E., et al., "Polarization effects in photoluminescence of C- and M-plane GaN/AlGaN multiple quantum wells", Applied Physics Letters, AIP, American Institute of Physics, Melville, NY, US., vol. 81, No. 22, Nov. 25, 2002, pp. 4130-4132, XP012032618.

Ng, H.M., "Molecular-beam epitaxy of GaN/Al$_x$Ga1-xN multiple quantum wells on R-plane (1012) sapphire substrates", Applied Physics Letters, AIP, American Institute of Physics, Mellville, NY, vol. 80, No. 23, Jun. 10, 2002, pp. 4369-4371, XP012031145, ISSN: 0003-6951.

Sun, W.H., et al., "Strong ultraviolet emission from non-polar AlGaN/GaN quantum wells grown over r-plane sapphire substrates", Physica Status Solidi A Wiley-VCH Germany, vol. 200, No. 1, Nov. 2003, pp. 48-51, XP002614885, ISSN: 0031-8965.

Bernardini, F. et al., "Spontaneous polarization and piezoelectric constants of III-V nitrides," Physical Review B, vol. 56, No. 16, Oct. 15, 1997, R10024.

Bhattacharyya, A. et al., "Comparative study of GaN/AlGaN MQWs grown homoepitaxially on (1100) and (0001) GaN," Journal of Crystal Growth 251 (2003) 487-493.

Bigenwald, P. et al., "Confined excitons in GaN-AlGaN quantum wells," Phys. Stat. Sol. (b) 216, 371 (1999).

Craven, M. et al., "Structural characterization of nonpolar (1120) a-plane GaN thin films grown on (1102) r-plane sapphire," Applied Physics Letters, vol. 81, No. 3, Jul. 15, 2002, 469.

Grandjean, N. et al., "Built-in electric-field effects in wurtzite AlGaN/GaN quantum wells," Journal of Applied Physics, vol. 86, No. 7, Oct. 1, 1999, 3714.

Grandjean, N. et al., "Self-limitation of AlGaN/GaN quantum well energy by built-in polarization field," Applied Physics Letters, vol. 74, No. 16, Apr. 19, 1999, 2361.

Im, J. et al., "Reduction of oscillator strength due to piezoelectric fields in GaN/Al$_x$Ga1-xN quantum wells," Physical Review B, vol. 57, No. 16, Apr. 15, 1998, R9435.

Keller, B. et al., "Metalorganic chemical vapor deposition growth of high optical quality and high mobility GaN," Journal of Electronic Materials, vol. 24, No. 11, 1995, 1707.

Kinoshita, A. et al., "Emission enhancement of GaN/AlGaN single-quantum-wells due to screening of piezoelectric field," MRS Internet J. Nitride Semicond. Res. 5, W11.32, 2000.

(56) References Cited

OTHER PUBLICATIONS

Langer, R. et al., "Giant electric fields in unstrained GaN single quantum wells," Applied Physics Letters, vol. 74, No. 25, Jun. 21, 1999, 3827.

Leroux, M. et al., "Quantum confined Stark effect due to built-in internal polarization fields in (Al,Ga)N/GaN quantum wells," Physical Review B, vol. 58, No. 20, Nov. 15, 1998, R13371.

Sasaki, T. et al., "Substrate-orientation dependence of GaN single-crystal films grown by metalorganic vapor-phase epitaxy," Journal of Applied Physics 61 (7), Apr. 1, 1987, 2533.

Takeuchi, T. et al., "Theoretical study of orientation dependence of piezoelectric effects in wurtzite strained GaInN/GaN heterostructures and quantum wells," Jpn. J. Appl. Phys., vol. 39 (2000), pp. 413-416.

Tan, I. et al., "A self-consistent solution of Schrodinger-Poisson equations using a nonuniform mesh," J. Appl. Phys. 68 (8), Oct. 15, 1990, 4071.

Traetta, G. et al., "Effects of the spontaneous polarization and piezoelectric fields on the luminescence spectra of $GaN/Al_{0.15}Ga_{0.85}N$ quantum wells," Physica E 7 (2000) 929-933.

Waltereit, P. et al., "Nitride semiconductors free of electrostatic fields for efficient white light-emitting diodes," Nature, vol. 406, Aug. 24, 2000, 865.

CN Office Action dated Jan. 6, 2009, Application No. 200380110999.5.

International Search Report dated Sep. 29, 2004, International application No. PCT/US03/39355.

KR Office Action dated Aug. 31, 2010, Application No. 10-2006-7013966.

Im et al., "Reduction of oscillator strength due to piezoelectric fields in $GaN/Al_xGa_{1-x}N$ quantum wells". Physical Review B, vol. 57, No. 16, (1998), pp. R9435-R9438.

EP Search Report dated Dec. 9, 2011, Application No. 03 790 447.1.

Japanese Notification of Allowance dated Sep. 11, 2012 for JP application No. 2005-512863.

Japanese Office Action dated Jan. 24, 2012 for Japanese application No. 2005-512863.

Nichizuka, K., "Efficient Radiative Recombination From <1122>-oriented $In_xGa_{1-x}N$ Multiple Quantum Wells Fabricated by the Regrowth Technique," Applied Physics Letters, Oct. 2004, vol. 85, No. 15, pp. 3122-3124, abstract.

Sharma, R., "Demonstration of a Semipolar (1013) InGaN/GaN Green Light Emitting Diode," Applied Physics Letters, Nov. 2005, vol. 87, 231110, pp. 1-3, abstract.

Waltereit et al., "M-Plane GaN(1 1 0 0) Grown on y-LiA102(1 0 0): Nitride Semiconductors Free of Internal Electrostatic Fields," Journal of Crystal Growth 227-228 (2001), pp. 437-441.

Ajoul et al., "Hydrogen and Nitrogen Ambient Effects on Epitaxial Growth of GaN by Hydride Vapour Phase Epitaxy," Journal of Crystal Growth 230 (2001), pp. 372-376.

Patent Abstracts of Japan, vol. 2002, No. 04, Aug. 4, 2002 & JP 2001 342100 A (Toshiba Corp), Dec. 11, 2001.

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

* cited by examiner

NON-POLAR (AL,B,IN,GA)N QUANTUM WELLS

CROSS-REFERENCE TO RELATED APPLICATIONS

This application is a continuation of the following co-pending and commonly-assigned Patent Application:

U.S. Utility patent application Ser. No. 10/582,390, filed Jun. 9, 2006, by Michael D. Craven and Steven P. DenBaars, entitled "NON-POLAR (Al,B,In,Ga)N QUANTUM WELLS", now abandoned, which application claims priority to International Patent Application No. PCT/US03/39355, filed Dec. 11, 2003, by Michael D. Craven and Steven P. DenBaars, entitled "NON-POLAR (Al,B,In,Ga)N QUANTUM WELLS", which application is a continuation-in-part of the following co-pending and commonly-assigned patent applications:

International Patent Application No. PCT/US03/21918, filed Jul. 15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY", which application claims priority to U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY";

International Patent Application No. PCT/US03/21916, filed Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY", which application claims priority to U.S. Provisional Patent Application Ser. No. 60/433,844, filed Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY";

U.S. Utility patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION", now abandoned, which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

U.S. Utility patent application Ser. No. 10/413,690, filed Apr. 15, 2003, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES, now U.S. Pat. No. 7,091,514, issued Aug. 15, 2006, which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

U.S. Utility patent application Ser. No. 10/413,913, filed Apr. 15, 2003, by Michael D. Craven, Stacia Keller, Steven P. DenBaars, Tal Margalith, James S. Speck, Shuji Nakamura, and Umesh K. Mishra, entitled "DISLOCATION REDUCTION IN NON-POLAR GALLIUM NITRIDE THIN FILMS", now U.S. Pat. No. 6,900,070, issued May 31, 2005, which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS";

all of which applications are incorporated by reference herein.

Field of the Invention

The invention is related to semiconductor materials, methods, and devices, and more particularly, to non-polar (Al,B,In,Ga)N quantum wells.

Description of the Related Art (Note: This application references a number of different publications as indicated throughout the specification by one or more reference numbers. A list of these different publications ordered according to these reference numbers can be found below in the section entitled "References." Each of these publications is incorporated by reference herein.)

Currently, state-of-the-art nitride-based epitaxial device structures are grown along the polar c-axis of the thermodynamically stable wurtzite (Al,Ga,In)N unit cell. Due to the strong polarization constants of the nitrides [1], interfacial polarization discontinuities within heterostructures are associated with fixed sheet charges which produce strong internal electric fields. These "built-in" polarization-induced electric fields limit the performance of optoelectronic devices which employ quantum well active regions. Specifically, the spatial separation of the electron and hole wavefunctions caused by the internal fields, i.e., the quantum confined Stark effect (QCSE), reduces the oscillator strength of transitions and ultimately restricts the recombination efficiency of the quantum well [2]. Nitride crystal growth along non-polar directions provides an efficient means of producing nitride-based quantum structures that are unaffected by these strong polarization-induced electric fields since the polar axis lies within the growth plane of the film.

(1 $\bar{1}$00) m-plane GaN/AlGaN multiple quantum well (MQW) structures were first demonstrated by plasma-assisted molecular beam epitaxy (MBE) using lithium aluminate substrates [3]. Since this first demonstration, free-standing m-plane GaN substrates grown by hydride vapor phase epitaxy (HVPE) were employed for subsequent epitaxial GaN/AlGaN MQW growths by both MBE [4] and metalorganic chemical vapor deposition (MOCVD) [5]. In addition to the m-plane, research efforts have investigated a-plane GaN/AlGaN MQW structures grown on r-plane sapphire substrates by both MBE [6] and MOCVD [7]. Optical characterization of these structures has shown that non-polar quantum wells are unaffected by polarization-induced electric fields.

The present invention describes the dependence of a-plane GaN/AlGaN MQW emission on the GaN quantum well width. Moreover, an investigation of a range of GaN well widths for MOCVD-grown a-plane and c-plane MQWs provides an indication of the emission characteristics that are unique to non-polar orientations.

SUMMARY OF THE INVENTION

The present invention describes a method of fabricating non-polar a-plane GaN/(Al,B,In,Ga)N multiple quantum wells (MQWs). In this regard, a-plane MQWs were grown on the appropriate GaN/sapphire template layers via metalorganic chemical vapor deposition (MOCVD) with well widths ranging from 20 Å to 70 Å. The room temperature photoluminescence (PL) emission energy from the a-plane MQWs followed a square well trend modeled using self-consistent Poisson-Schrodinger (SCPS) calculations. Optimal PL emission intensity is obtained at a quantum well width of 52 Å for the a-plane MQWs.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Non-polar nitride-based semiconductor crystals do not experience the effects of polarization-induced electric fields that dominate the behavior of polar nitride-based quantum structures. Since the polarization axis of a wurtzite nitride unit cell is aligned parallel to the growth direction of polar nitride crystals, internal electric fields are present in polar nitride heterostructures. These "built-in" fields have a detrimental effect on the performance of state-of-the-art optoelectronic and electronic devices. By growing nitride crystals along non-polar directions, quantum structures not influenced by polarization-induced electric fields are realized. Since the energy band profiles of a given quantum well change depending upon the growth orientation, different scientific principles must be applied in order to design high performance non-polar quantum wells. This invention describes the design principles used to produce optimized non-polar quantum wells.

Process Steps

Figure 1:
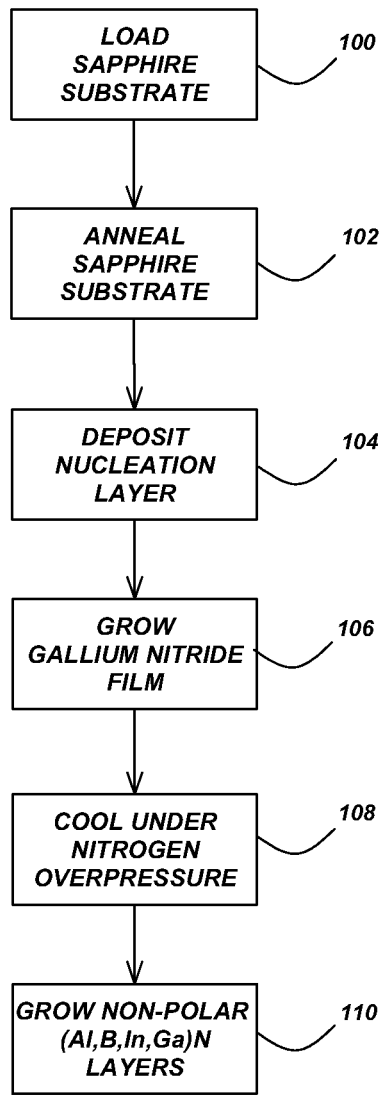
FIG. 1 is a flowchart that illustrates the steps of a method for forming non-polar a-plane GaN/(Al,B,In,Ga)N quantum wells according to a preferred embodiment of the present invention.

FIG. 1 is a flowchart that illustrates the steps of a method for forming quantum wells according to a preferred embodiment of the present invention. The steps of this method grow non-polar a-plane GaN/AlGaN MQWs on a-plane GaN/r-plane sapphire template layers.

Block 100 represents loading of a sapphire substrate into a vertical, close-spaced, showerhead MOCVD reactor. For this step, epi-ready sapphire substrates with surfaces crystallographically oriented within +/−2° of the sapphire r-plane may be obtained from commercial vendors. No ex-situ preparations need be performed prior to loading the sapphire substrate into the MOCVD reactor, although ex-situ cleaning of the sapphire substrate could be used as a precautionary measure.

Block 102 represents annealing the sapphire substrate in-situ at a high temperature (>1000° C.), which improves the quality of the substrate surface on the atomic scale. After annealing, the substrate temperature is reduced for the subsequent low temperature nucleation layer deposition.

Block 104 represents depositing a thin, low temperature, low pressure, nitride-based nucleation layer as a buffer layer on the sapphire substrate. Such layers are commonly used in the heteroepitaxial growth of c-plane (0001) nitride semiconductors. In the preferred embodiment, the nucleation layer is comprised of, but is not limited to, 1-100 nanometers (nm) of GaN deposited at approximately 400-900° C. and 1 atm.

After depositing the nucleation layer, the reactor temperature is raised to a high temperature, and Block 106 represents one or more growing unintentionally doped (UID) a-plane GaN layers to a thickness of approximately 1.5 μm on the nucleation layer deposited on the substrate. The high temperature growth conditions include, but are not limited to, approximately 1100° C. growth temperature, 0.2 atm or less growth pressure, 30 μmol per minute Ga flow, and 40,000 μmol per minute N flow, thereby providing a V/III ratio of approximately 1300). In the preferred embodiment, the precursors used as the group III and V sources are trimethylgallium, ammonia and disilane, although alternative precursors could be used as well. In addition, growth conditions may be varied to produce different growth rates, e.g., between 5 and 9 Å per second, without departing from the scope of the present invention.

Upon completion of the high temperature growth step, Block 108 represents cooling the epitaxial a-plane GaN layers down under a nitrogen overpressure.

Finally, Block 110 represents one or more (Al,B,In,Ga)N layers being grown on the a-plane GaN layers. Preferably, these grown layers comprise ~100 Å $Al_{0.16}Ga_{0.84}N$ barriers doped with an Si concentration of ~$2\times10^{18}$ cm$^{-3}$. Moreover, the above Blocks may be repeated as necessary. In one example, Block 110 was repeated 10 times to form UID GaN wells ranging in width from approximately 20 Å to approximately 70 Å.

Experimental Results

For non-polar nitride quantum wells, flat energy band profiles exist and the QCSE is not present. Consequently, non-polar quantum well emission is expected to follow different trends as compared to polar quantum wells. Primarily, non-polar quantum wells exhibit improved recombination efficiency, and intense emission from thicker quantum wells is possible. Moreover, the quantum well width required for optimal non-polar quantum well emission is larger than for polar quantum wells.

The following describes the room temperature PL characteristics of non-polar GaN/(~100 Å $Al_{0.16}Ga_{0.84}N$) MQWs in comparison to c-plane structures as a function of quantum well width. To accomplish this, 10-period a-plane and c-plane MQWs structures were simultaneously regrown on the appropriate GaN/sapphire template layers via MOCVD with well widths ranging from approximately 20 Å to 70 Å.

Kinematic analysis of HRXRD measurements [9] made with a Philips MRD XPERT PRO™ diffractometer using $CuK_{\alpha 1}$ radiation in triple axis mode confirmed the quantum well dimensions and barrier composition. Room temperature continuous-wave (c-w) PL spectroscopy using the 325 nm line of a He—Cd laser (excitation power density ~10 W/cm2) was used to characterize the MQW emission properties.

Figure 2:
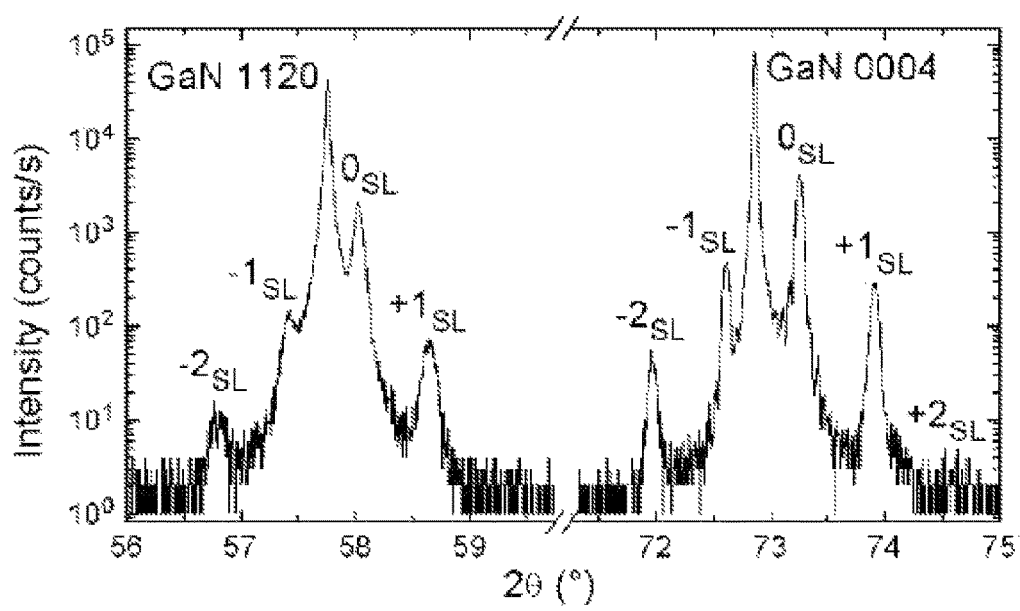
FIG. 2 is a graph of high-resolution x-ray diffraction (HRXRD) scans of simultaneously regrown a-plane (69 Å GaN)/(96 Å $Al_{0.16}Ga_{0.84}N$) and c-plane (72 Å GaN)/(98 Å $Al_{0.16}Ga_{0.84}N$) MQW stacks. In addition to the quantum well dimensions, the HRXRD profiles provide a qualitative comparison of the MQW interface quality through the full width at half maximum (FWHM) of the satellite peaks.

FIG. 2 is a graph of HRXRD scans of simultaneously regrown a-plane 69 Å GaN/96 Å $Al_{0.16}Ga_{0.84}N$ and c-plane 72 Å GaN/98 Å $Al_{0.16}Ga_{0.84}N$ MQW stacks. In addition to the quantum well dimensions, the HRXRD profiles provide a qualitative comparison of the MQW interface quality through the FWHM of the satellite peaks.

The on-axis 2θ-ω scans of the a-plane and c-plane structures were taken about the GaN ($11\bar{2}0$) and (0004) reflections, respectively. Analysis of the x-ray profiles yields both the aluminum composition x of the $Al_xGa_{1-x}N$ barriers and the quantum well dimensions (well and barrier thickness), which agree within 7% for the simultaneously grown a-plane and c-plane samples indicating a mass transport limited MOCVD growth regime. Both HRXRD profiles reveal superlattice (SL) peaks out to the second order in addition to strong reflections from the GaN layers. The FWHMs of the SL peaks provide a qualitative metric of the quantum well interface quality [10]; therefore, from the scans shown in FIG. 2, a conclusion can be made that the interface quality of a-plane MQWs is inferior to that of the c-plane samples. Analysis of the a-plane MQW structural quality (described in [9]) revealed sharp interfaces despite the large threading dislocation density extending through the MQW from the a-GaN template. The higher threading dislocation (TD) density and increased surface roughness of the a-plane growth in comparison to c-plane are the most likely causes for greater a-plane MQW interface roughness and SL peak broadening. Additionally, it is estimated that the a-plane TD density is approximately two orders of magnitude greater than the c-plane TD density.

Figure 3A:
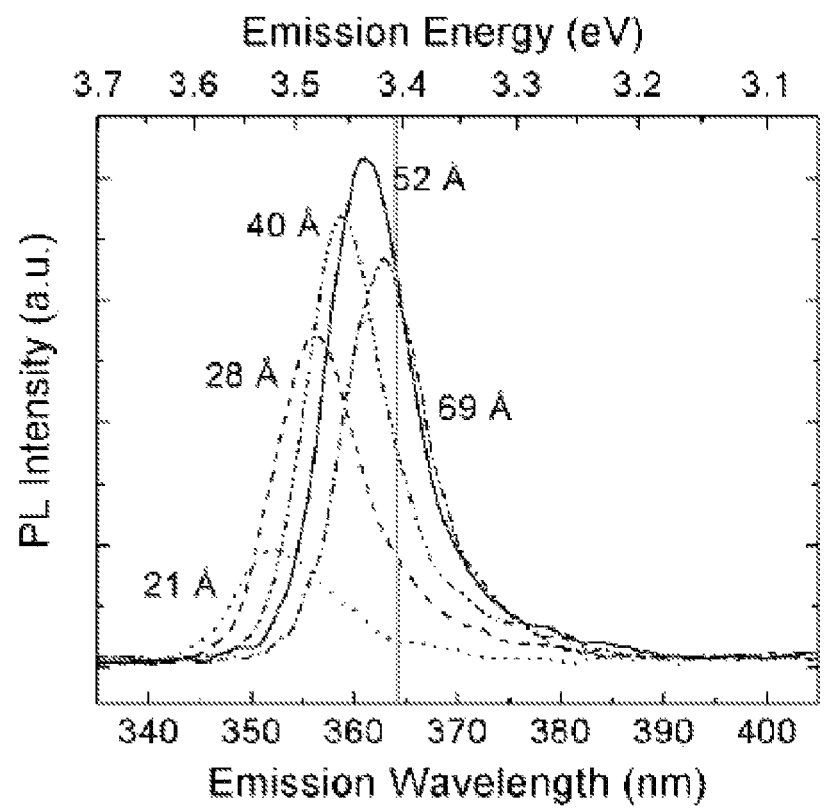
FIGS. 3(a) and (b) are graphs of room temperature PL spectra of the (a) a-plane and (b) c-plane GaN/(100 Å $Al_{0.16}Ga_{0.84}N$) MQWs with well widths ranging from 20 Å-70 Å. The vertical gray line on each plot denotes a band edge of the bulk GaN layers.
Figure 3B:
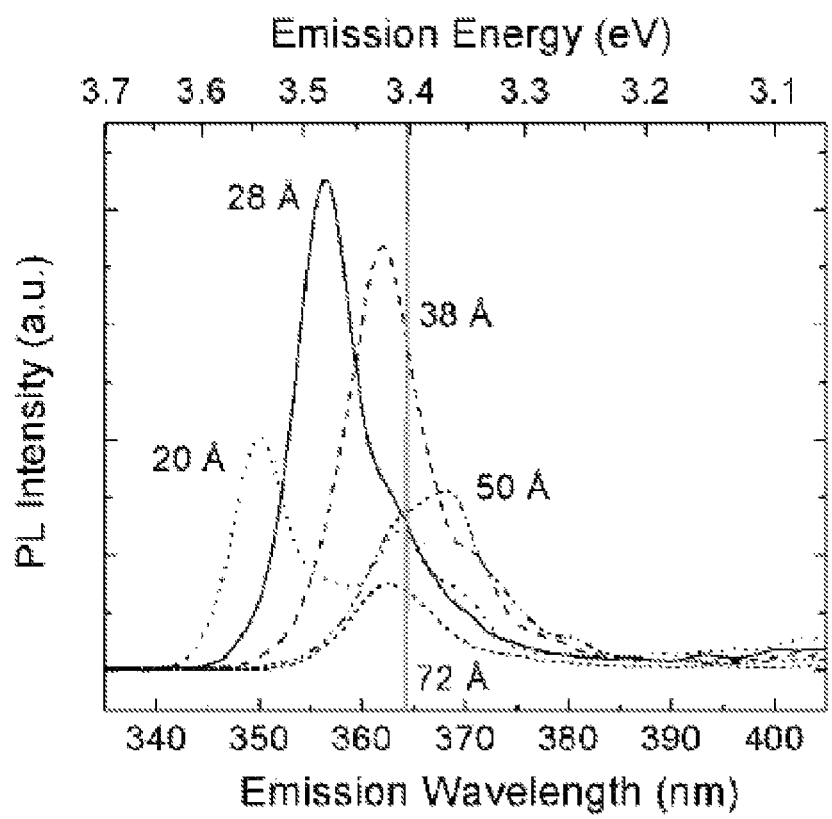

FIGS. 3(*a*) and (*b*) are graphs of room temperature PL spectra of the (a) a-plane and (b) c-plane GaN/(100 Å $Al_{0.16}Ga_{0.84}N$) MQWs with well widths ranging from ~20 Å to ~70 Å. The vertical gray line on each plot denotes the bulk GaN band edge.

Independent of crystal orientation, the MQW PL emission shifts to longer wavelengths (equivalently, the PL emission decreases) with increasing quantum well width as the quantum confinement is reduced.

In particular, the emission energies of the a-plane MQWs steadily approach but do not red-shift beyond the bulk GaN band edge as the well width increases. The resistive nature of UID a-GaN films prevents band edge emission at room temperature, resulting in emissions only from the quantum wells, as is observed in FIG. 3(*a*).

Conversely, the c-plane MQW emission energy red-shifts below the GaN band edge when the GaN quantum well width is increased from 38 Å to 50 Å. For polar GaN wells wider than 50 Å, only PL emission from the underlying GaN was detected. The appearance of c-GaN buffer emission implies that the c-plane template has a lower native point defect density than the a-plane template. Furthermore, yellow band emission was observed for both the non-polar and polar MQWs; therefore, the origin of deep trap levels is most likely the growth conditions required to maintain the a-plane morphology and not a characteristic of the non-polar orientation.

Figure 4:
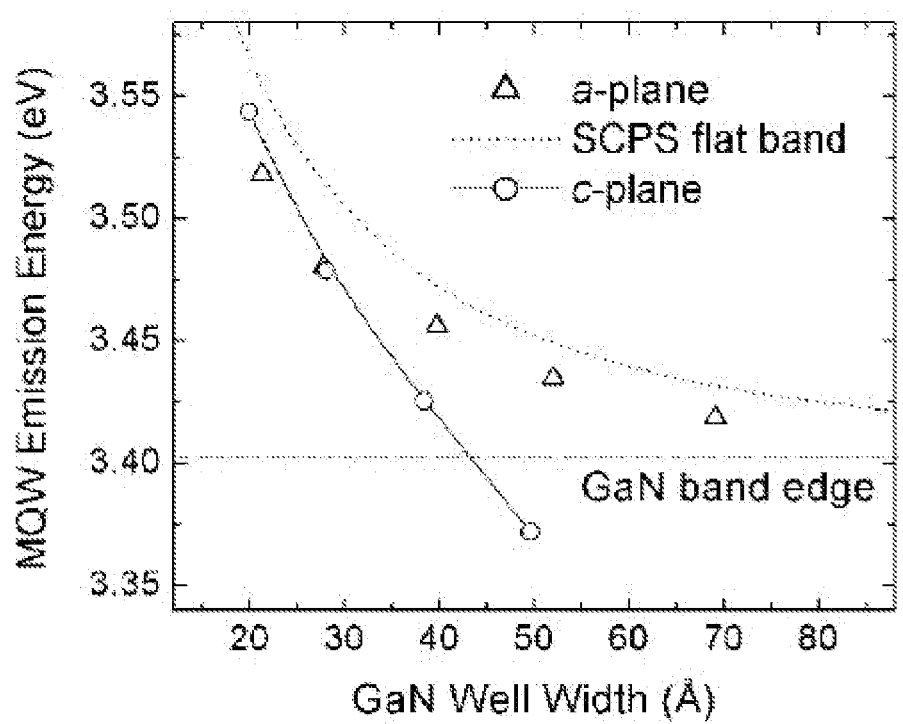
FIG. 4 is a graph of the well width dependence of the room temperature PL emission energy of the a-plane and c-plane MQWs. The dotted line is the result of self-consistent Poisson-Schrodinger (SCPS) calculations for a flat-band GaN/(100 Å $Al_{0.16}Ga_{0.84}N$) MQW. The emission energy decreases with increasing well width for both growth orientations but above a critical well width, the c-plane MQW emission energy red-shifts below the band edge of the GaN layers.
Figure 5:
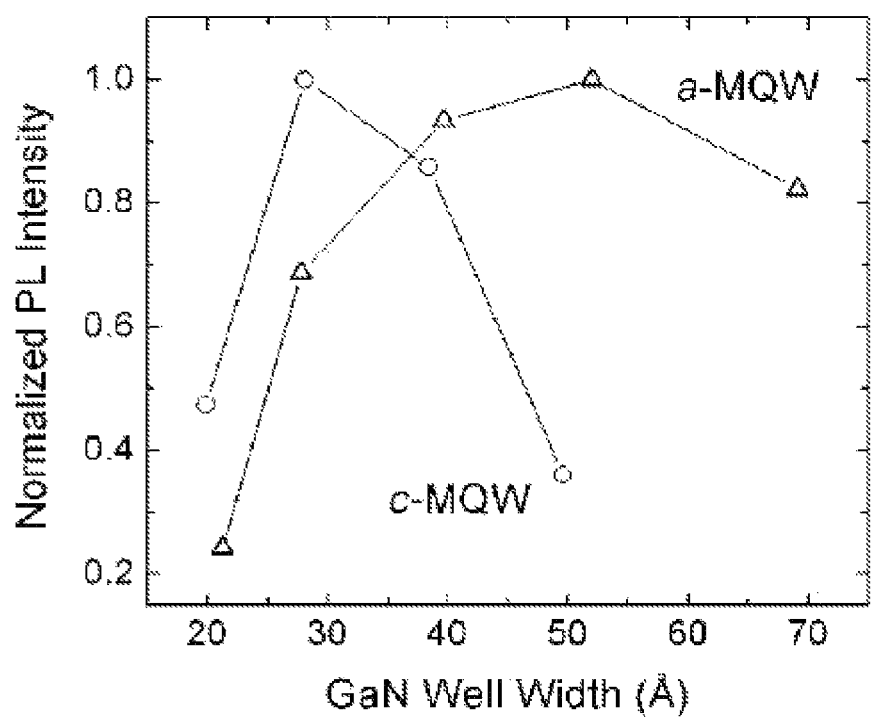
FIG. 5 is a graph of the normalized room temperature PL intensity plotted as a function of GaN quantum well width for both a-plane and c-plane growth orientations. The data for each orientation is normalized separately, hence direct comparisons between the relative intensities of a-plane and c-plane MQWs are not possible.

The two primary features of the PL emission spectra, the emission energy and the emission intensity, are summarized in FIGS. 4 and 5, respectively, as functions of quantum well width. The emission energy decreases with increasing well width due to quantum confinement effects.

FIG. 4 is a graph of the well width dependence of the room temperature PL emission energy of the a-plane and c-plane MQWs. For all quantum well widths studied, the a-plane MQW emission is blue-shifted with respect to the bulk GaN band edge and the blue-shift increases with decreasing well width as quantum confinement raises the quantum well's ground-state energy. The a-plane MQW emission energy trend is modeled accurately using square well SCPS calculations [11] shown as the dotted line in FIG. 4. The agreement between theory and experiment confirms that emission from non-polar MQWs is not influenced by polarization-induced electric fields. Despite this agreement, the theoretical model increasingly over-estimates the experimental data with decreasing quantum well width by 15 to 35 meV. The deviating trend can be explained by the expected increase in exciton binding energy with decreasing well width for GaN/AlGaN MQWs [12,13], since exciton binding energies are not accounted for in the SCPS model. Conversely, FIG. 4 shows the dramatic red-shift in c-plane MQW emission with increasing well width, a widely observed trend dictated by the QCSE [14-18]. Specifically, the experimental c-plane MQW emission energy trend agrees with the model of the polar QW ground state proposed by Grandjean et al. [13]. Interpolating the experimental data, the emission from c-plane MQWs with GaN well widths greater than ~43 Å is below the bulk GaN band edge. Increasing the well thickness increases the spatial separation of charge carriers within the quantum wells and the recombination efficiency is reduced until MQW emission is no longer observed (wells wider than 50 Å). Previously reported emission from an a-plane (107 Å GaN)/(101 Å $Al_{0.25}Ga_{0.75}N$) MQW [9] provides additional evidence of the improved quantum efficiency for non-polar MQWs.

FIG. 5 is a graph of the normalized room temperature PL emission intensity plotted as a function of GaN quantum well width for both a-plane and c-plane growth orientations. The data for each orientation is normalized separately, hence direct comparisons between the relative intensities of a-plane MQWs and c-plane MQWs are not possible. Since the microstructural quality of the template layers is substantially different, a direct comparison between a- and c-plane MQW emission intensity would be inconclusive.

A maximum a-plane MQW emission intensity is associated with an optimal quantum well width of 52 Å, while the maximum c-plane emission intensity is observed for 28 Å-wide wells. As a result of the QCSE, optimal emission intensity is obtained from relatively thin polar GaN quantum wells (20 Å-35 Å) depending on the thickness and composition of the AlGaN barrier layers [13]. The balance between reduced recombination efficiency in thick wells and the reduced recombination due to increased nonradiative transitions at heterointerfaces and extension of electron wavefunctions outside of thin wells [19] determines the optimal c-plane well width. Conversely, since the non-polar MQWs do not experience the QCSE, it is expected that the optimal well width is determined by material quality, interface roughness, and the excitonic Bohr radius. Although the interface roughness of the a-plane structures is greater than the c-plane, the advantageous effects of a non-polar orientation are apparent. Also note that, with improved non-polar surface and interface quality, the optimal well width will most likely shift from the optimal width observed for these samples.

REFERENCES

The following references are incorporated by reference herein:
1. F. Bernardini, V. Fiorentini, and D. Vanderbilt, Phys. Rev. B 56, R10024 (1997).
2. T. Takeuchi, H. Amano, and I. Akasaki, Jpn. J. Appl. Phys. 39, 413 (2000).
3. P. Waltereit, O. Brandt, A. Trampert, H. T. Grahn, J. Menniger, M. Ramsteiner, M. Reiche, and K. H. Ploog, Nature 406, 865 (2000).
4. A. Bhattacharyya, I. Friel, S. Iyer, T. C. Chen, W. Li, J. Cabalu, Y. Fedyunin, K. F. Ludwig, T. D. Moustakas, H. P. Maruska, D. W. Hill, J. J. Gallagher, M. C. Chou, and B. Chai, J. Cryst. Growth 251, 487 (2003).
5. E. Kuokstis, C. Q. Chen, M. E. Gaevski, W. H. Sun, J. W. Yang, G. Simin, M. A. Khan, H. P. Maruska, D. W. Hill, M. C. Chou, J. J. Gallagher, and B. Chai, Appl. Phys. Lett. 81, 4130 (2002).
6. H. M. Ng, Appl. Phys. Lett. 80, 4369 (2002).
7. M. D. Craven, S. H. Lim, F. Wu, J. S. Speck, and S. P. DenBaars, Appl. Phys. Lett. 81, 469 (2002).
8. B. P. Keller, S. Keller, D. Kapolnek, W. N. Jiang, Y. F. Wu, H. Masui, X. Wu, B. Heying, J. S. Speck, U. K. Mishra, and S. P. Denbaars, J. Electron. Mater. 24, 1707 (1995).
9. M. D. Craven, P. Waltereit, F. Wu, J. S. Speck, and S. P. DenBaars, Jpn. J. Appl. Phys., Part 2 42, L235 (2003).
10. G. Bauer and W. Richter, Optical characterization of epitaxial semiconductor layers (Springer Verlag, Berlin, New York, 1996).
11. I. H. Tan, G. L. Snider, L. D. Chang, and E. L. Hu, J. Appl. Phys. 68, 4071 (1990).
12. P. Bigenwald, P. Lefebvre, T. Bretagnon, and B. Gil, Phys. Stat. Sol. B 216, 371 (1999).
13. N. Grandjean, B. Damilano, S. Dalmasso, M. Leroux, M. Laugt, and J. Massies, J. Appl. Phys. 86, 3714 (1999).
14. N. Grandjean, J. Massies, and M. Leroux, Appl. Phys. Lett. 74, 2361 (1999).
15. I. Jin Seo, H. Kollmer, J. Off, A. Sohmer, F. Scholz, and A. Hangleiter, Phys. Rev. B 57, R9435 (1998).
16. R. Langer, J. Simon, V. Ortiz, N. T. Pelekanos, A. Barski, R. Andre, and M. Godlewski, Appl. Phys. Lett. 74, 3827 (1999).
17. G. Traetta, A. Passaseo, M. Longo, D. Cannoletta, R. Cingolani, M. Lomascolo, A. Bonfiglio, A. Di Carlo, F. Della Sala, P. Lugli, A. Botchkarev, and H. Morkoc, Physica E 7, 929 (2000).
18. M. Leroux, N. Grandjean, M. Laugt, J. Massies, B. Gil, P. Lefebvre, and P. Bigenwald, Phys. Rev. B 58, R13371 (1998).
19. A. Kinoshita, H. Hirayama, P. Riblet, M. Ainoya, A. Hirata, and Y. Aoyagi, MRS Internet J. Nitride Semicond. Res. 5, W11.32 (2000).

CONCLUSION

This concludes the description of the preferred embodiment of the present invention. The following describes some alternative embodiments for accomplishing the present invention.

For example, variations in non-polar (Al,In,Ga)N quantum wells and heterostructures design and MOCVD growth conditions may be used in alternative embodiments. Moreover, the specific thickness and composition of the layers, in addition to the number of quantum wells grown, are variables inherent to quantum well structure design and may be used in alternative embodiments of the present invention.

Further, the specific MOCVD growth conditions determine the dimensions and compositions of the quantum well structure layers. In this regard, MOCVD growth conditions are reactor dependent and may vary between specific reactor designs. Many variations of this process are possible with the variety of reactor designs currently being using in industry and academia.

Variations in conditions such as growth temperature, growth pressure, VIII ratio, precursor flows, and source materials are possible without departing from the scope of the present invention. Control of interface quality is another important aspect of the process and is directly related to the flow switching capabilities of particular reactor designs. Continued optimization of the growth conditions will result in more accurate compositional and thickness control of the integrated quantum well layers described above.

In addition, a number of different growth methods other than MOCVD could be used in the present invention. For example, the growth method could also be molecular beam epitaxy (MBE), liquid phase epitaxy (LPE), hydride vapor phase epitaxy (HVPE), sublimation, or plasma-enhanced chemical vapor deposition (PECVD).

Finally, substrates other than sapphire could be employed. These substrates include silicon carbide, gallium nitride, silicon, zinc oxide, boron nitride, lithium aluminate, lithium niobate, germanium, aluminum nitride, and lithium gallate.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A semiconductor device structure, comprising:
   (a) an initial non-polar (Al, B, In, Ga)N layer in the structure, wherein the initial non-polar (Al, B, In, Ga)N layer comprises a first non-polar (Al, B, In, Ga)N layer grown on or above a substrate, the initial non-polar (Al, B, In, Ga)N layer has a growth surface for subsequent layers that is a grown surface, and the grown surface is a non-polar plane; and

(b) one or more subsequent non-polar (Al, B, In, Ga)N layers grown directly on or above the growth surface of the initial non-polar (Al, B, In, Ga)N layer;

(c) wherein the non-polar (Al, B, In, Ga)N layers form at least one non-polar (Al, B, In, Ga)N quantum well and the non-polar (Al, B, In, Ga)N quantum well has a width of 5 nm or more for generating light at a maximum emission intensity.

2. The device of claim 1, wherein the initial non-polar (Al, B, In, Ga)N layer is grown on or above a nucleation layer grown on the substrate.

3. The device of claim 2, wherein the substrate is an r-plane sapphire.

4. The device of claim 1, wherein the non-polar (Al, B, In, Ga)N quantum well has a barrier layer doped with silicon.

5. The device of claim 4, wherein the silicon has a concentration of $2 \times 10^{18}$ cm$^{-3}$.

6. The device of claim 1, wherein the non-polar (Al, B, In, Ga)N quantum well has a width between 50 Å and 55 Å for generating light at the maximum emission intensity.

7. The device of claim 6, wherein the non-polar (Al, B, In, Ga)N quantum well has a width of 52 Å for generating light at the maximum emission intensity.

8. The device of claim 1, wherein the non-polar (Al, B, In, Ga)N quantum well is a non-polar GaN/AlGaN quantum well.

9. The structure of claim 1, wherein the initial non-polar (Al, B, In, Ga)N layer is an unintentionally-doped (UID) layer.

10. A method for fabricating a semiconductor device structure, comprising:

(a) growing an initial non-polar (Al, B, In, Ga)N layer in the structure, wherein the initial non-polar (Al, B, In, Ga)N layer comprises a first non-polar (Al, B, In, Ga)N layer grown on or above a substrate, the initial non-polar (Al, B, In, Ga)N layer has a growth surface for subsequent layers that is a grown surface, and the grown surface is a non-polar plane; and (b) growing one or more subsequent non-polar (Al, B, In, Ga)N layers directly on or above the growth surface of the initial non-polar (Al, B, In, Ga)N layer;

(c) wherein the non-polar (Al, B, In, Ga)N layers form at least one non-polar (Al, B, In, Ga)N quantum well and the non-polar (Al, B, In, Ga)N quantum well has a width of 5 nm or more for generating light at a maximum emission intensity.

11. The method of claim 10, wherein the initial non-polar (Al, B, In, Ga)N layer is grown on or above a nucleation layer grown on the substrate.

12. The method of claim 11, wherein the substrate is an r-plane sapphire.

13. The method of claim 10, wherein the non-polar (Al, B, In, Ga)N quantum well has a barrier layer doped with silicon.

14. The method of claim 13, wherein the silicon has a concentration of $2 \times 10^{18}$ cm$^{-3}$.

15. The method of claim 10, wherein the non-polar (Al, B, In, Ga)N quantum well has a width between 50 Å and 55 Å for generating light at the maximum emission intensity.

16. The method of claim 15, wherein the non-polar (Al, B, In, Ga)N quantum well has a width of 52 Å for generating light at the maximum emission intensity.

17. The method of claim 10, wherein the non-polar (Al, B, In, Ga)N quantum well is a non-polar GaN/AlGaN quantum well.

18. The method of claim 10, wherein the initial non-polar (Al, B, In, Ga)N layer is an unintentionally-doped (UID) layer.

* * * * *